United States Patent
Moore et al.

(10) Patent No.: US 6,429,151 B1
(45) Date of Patent: Aug. 6, 2002

(54) SEMICONDUCTOR WAFER ASSEMBLIES COMPRISING SILICON NITRIDE, METHODS OF FORMING SILICON NITRIDE, AND METHODS OF REDUCING STRESS ON SEMICONDUCTIVE WAFERS

(75) Inventors: John T. Moore; Scott J. DeBoer; Mark Fischer, all of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 7 days.

(21) Appl. No.: 09/619,468

(22) Filed: Jul. 19, 2000

Related U.S. Application Data

(60) Continuation of application No. 09/100,530, filed on Jun. 18, 1999, now Pat. No. 6,093,956, which is a division of application No. 09/057,152, filed on Apr. 7, 1998, now Pat. No. 5,985,771.

(51) Int. Cl.[7] .............................................. H01L 21/31
(52) U.S. Cl. ...................... 438/791; 438/57; 438/441; 438/638; 257/610; 257/635
(58) Field of Search ................................ 438/791, 441, 438/638, 57; 257/635, 610

(56) References Cited

U.S. PATENT DOCUMENTS

| | | | |
|---|---|---|---|
| 3,549,411 A | 12/1970 | Bean ........................... | 438/791 |
| 3,649,884 A | 3/1972 | Haneta ......................... | 257/325 |
| 3,884,698 A | 5/1975 | Kakihama et al. ........... | 430/510 |
| 4,075,367 A | 2/1978 | Gulett ......................... | 134/1.3 |
| 4,330,569 A | 5/1982 | Gulett et al. ................ | 427/539 |
| 4,439,270 A | 3/1984 | Powell et al. ............... | 438/701 |
| 4,446,194 A | 5/1984 | Candelaria et al. .......... | 428/428 |

(List continued on next page.)

FOREIGN PATENT DOCUMENTS

| | | |
|---|---|---|
| GB | 2129217 | 5/1984 |
| GB | 2145243 | 3/1985 |
| GB | 2170649 | 8/1986 |
| JP | 362137854 | 6/1987 |
| JP | 401086562 | 3/1989 |
| JP | 403075158 | 3/1991 |

OTHER PUBLICATIONS

Wolf, S., "Silicon Processing for the VLSI Era", vol. 1: Process Technology, Lattice Press 1986, pp. 177–178.

Wolf, S., "Silicon Processing for the VLSI Era", vol. 1: Process Technology, Lattice Press 1986, pp. 191–193.

(List continued on next page.)

*Primary Examiner*—Richard Elms
*Assistant Examiner*—Pho M. Luu
(74) *Attorney, Agent, or Firm*—Wells St, John P.S.

(57) ABSTRACT

In one aspect, the invention includes a method of semiconductive wafer processing comprising forming a silicon nitride layer over a surface of a semiconductive wafer, the silicon nitride layer comprising at least two portions, one of said at least two portions generating a compressive force against the other of the at least two portions, and the other of the at least two portions generating a tensile force against the one of the at least two portions. In another aspect, the invention includes a method of reducing stress on semiconductive wafer, the semiconductive wafer having a pair of opposing surfaces and having more silicon nitride over one of the opposing surfaces than over the other of the opposing surfaces, the method comprising providing the silicon nitride over the one of the opposing surfaces to comprise a first portion, a second portion and a third portion, the first, second and third portions being elevationally displaced relative to one another, the second portion being between the first and third portions, the second portion having a greater stoichiometric amount of silicon than the first and third portions, the semiconductive wafer being subjected to less stress than if the silicon nitride over the one of the opposing surfaces had a constant stoichiometric amount of silicon throughout its thickness. In yet other aspects, the invention includes semiconductive wafer assemblies.

12 Claims, 3 Drawing Sheets

U.S. PATENT DOCUMENTS

| | | | |
|---|---|---|---|
| 4,485,553 A | 12/1984 | Christian et al. | 438/458 |
| 4,499,656 A | 2/1985 | Fabian et al. | 438/571 |
| 4,543,707 A | 10/1985 | Ito et al. | 438/701 |
| 4,612,629 A | 9/1986 | Harari | 365/185.08 |
| 4,695,872 A | 9/1987 | Chatterjee | 257/700 |
| 4,698,787 A | 10/1987 | Mukherjee et al. | 365/185.3 |
| 4,732,858 A | 3/1988 | Brewer et al. | 438/780 |
| 4,868,632 A | 9/1989 | Hayashi et al. | 257/411 |
| 4,874,716 A | 10/1989 | Rao | 438/257 |
| 4,939,559 A | 7/1990 | DiMaria et al. | 257/38 |
| 4,996,081 A | 2/1991 | Ellul et al. | 438/762 |
| 5,045,345 A | 9/1991 | Singer | 345/81 |
| 5,045,847 A | 9/1991 | Tarui et al. | 345/84 |
| 5,098,865 A | 3/1992 | Machado et al. | 438/788 |
| 5,129,788 A | 7/1992 | Abernathey et al. | 417/52 |
| 5,160,998 A | 11/1992 | Itoh et al. | 257/760 |
| 5,178,016 A | 1/1993 | Dauenhauer et al. | 73/727 |
| 5,304,829 A | 4/1994 | Mori et al. | 514/389 |
| 5,306,946 A | 4/1994 | Yamamoto | 257/640 |
| 5,442,223 A | 8/1995 | Fujii | 257/506 |
| 5,489,542 A | 2/1996 | Iwai et al. | 438/624 |
| 5,518,946 A | 5/1996 | Kuroda | 438/396 |
| 5,523,616 A | 6/1996 | Den | 257/637 |
| 5,554,418 A | 9/1996 | Ito et al. | 438/579 |
| 5,587,344 A | 12/1996 | Ishikawa | 438/786 |
| 5,756,404 A | 5/1998 | Friedenreich et al. | 438/791 |
| 5,773,325 A | 6/1998 | Teramoto | 438/151 |
| 5,795,821 A | 8/1998 | Bacchetta et al. | 438/624 |
| 5,831,321 A | 11/1998 | Nagayama | 438/412 |
| 5,834,374 A | 11/1998 | Cabral, Jr. et al. | 438/685 |
| 5,877,069 A * | 3/1999 | Robinson | 438/441 |
| 5,882,978 A | 3/1999 | Srinivasan et al. | 438/396 |
| 5,891,793 A | 4/1999 | Gardner et al. | 438/585 |
| 5,904,523 A | 5/1999 | Feldman et al. | 438/263 |
| 5,918,147 A | 6/1999 | Filipiak et al. | 438/636 |
| 5,925,494 A | 7/1999 | Horn | 430/270.1 |
| 5,926,739 A | 7/1999 | Rolfson et al. | 438/763 |
| 5,985,771 A | 11/1999 | Moore et al. | 438/791 |
| 6,093,956 A * | 7/2000 | Moore et al. | 257/635 |
| 6,103,619 A * | 8/2000 | Lai | 438/638 |
| 6,140,181 A | 10/2000 | Forbes et al. | 438/257 |
| 6,143,627 A * | 11/2000 | Robinson | 438/441 |
| 6,265,241 B1 * | 7/2001 | Pan | 438/57 |

OTHER PUBLICATIONS

Wolf, S., "Silicon Processing for the VLSI Era", vol. 2: Process Integration, S. Wolf, pp. 37–38, 598–599.

Mayer, J. et al., "Electronic Materials Science: For Integrated Circuits in Si and GaAs", Macmillan Pub. Co. 1990, pp. 269–274.

Abstract: Kanicki, J. et al., "Intrinsic Stress in Silicon Nitride and Silicon Dioxide Films Prepared by Various Deposition Techniques", 1988 IEEE Internatl. Sympos. on Elect. Insulation, Boston, MA (Jun. 5–8, 1988), 1 page.

Chang, E. et al., "Passivation of GaAs FET's with PECVD Silicon Nitride Films of Different Stress States", IEEE Transactions on Electron Devices, vol. 35, No. 9 (Sep. 1988), pp. 1412–1418.

Kovac, Z. et al., "Silicon Nitride Overcoats for Thin Film Magnetic Recording Media", IEEE Transactions on Magnetics, vol. 27, No. 6, (Nov. 1991), pp. 5070–5072.

* cited by examiner

SEMICONDUCTOR WAFER ASSEMBLIES COMPRISING SILICON NITRIDE, METHODS OF FORMING SILICON NITRIDE, AND METHODS OF REDUCING STRESS ON SEMICONDUCTIVE WAFERS

RELATED PATENT DATA

This patent resulted from a continuation application of U.S. patent application Ser. No. 09/100,530 now U.S. Pat. No. 6,093,951, filed on Jun. 18, 1998; which is a divisional application of U.S. patent application Ser. No. 09/057,152, now U.S. Pat. No. 5,985,771 filed on Apr. 7, 1998.

TECHNICAL FIELD

The invention pertains to semiconductor wafer assemblies comprising silicon nitride layers, and to methods of forming silicon nitride layers during semiconductor wafer processing.

BACKGROUND OF THE INVENTION

Modern semiconductor wafer fabrication frequently incorporates silicon nitride layers into process steps. For example, silicon nitride layers can be utilized to electrically insulate conductive components. As another example, silicon nitride layers can be utilized to protect regions of a semiconductive wafer during local oxidation of silicon (LOCOS).

An example prior art LOCOS fabrication process is described with reference to FIGS. 1–3. Referring to FIG. 1, a semiconductor wafer fragment 10 comprises a substrate 12 having a pair of opposing surfaces 14 and 16. Substrate 12 can comprise, for example, monocrystalline silicon lightly doped with a p-type dopant. To aid in interpretation of the claims that follow, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Silicon dioxide layers 18 and 20 are formed over surfaces 14 and 16, respectively, and silicon nitride layers 22 and 24 are formed over silicon dioxide layers 18 and 20, respectively. Silicon dioxide a layers 18 and 20 function as pad oxide layers to protect substrate 12 from stress induced by silicon nitride layers 22 and 24. Silicon dioxide layers 18 and 20 can be formed by, for example, exposing a silicon-comprising substrate 12 to an oxygen ambient to grow layers 18 and 20 from the silicon of the substrate. Silicon nitride layers 22 and 24 can be formed by, for example, chemical vapor deposition of silicon nitride over silicon dioxide layers 18 and 20.

Silicon nitride layers 22 and 24 typically comprise $Si_3N_4$. $Si_3N_4$ often requires discrete antireflective coating layers intermediate it and an overlying photoresist layer. Accordingly, $Si_3N_4$ does not have very good inherent antireflective properties. Antireflective coatings are utilized during photolithographic processing of photoresist layers to absorb light passing through the photoresist layers. Antireflective coatings can thereby prevent light from being reflected from beneath the photoresist layer to constructively and/or destructively interfere with other light propagating through the photoresist layer.

Although $Si_3N_4$ generally requires discrete antireflective coating layers intermediate it and an overlying photoresist layer, silicon enriched silicon nitride layers (i.e., silicon nitride layers having a greater concentration of silicon than $Si_3N_4$, such as, for example, $Si_4N_4$) frequently do not. However, silicon enriched silicon nitride is difficult to pattern due to a resistance of the material to etching. Silicon enriched silicon nitride layers are formed to have a substantially homogenous composition throughout their thicknesses, although occasionally a small portion of a layer (1% or less of a thickness of the layer) is less enriched with silicon than the remainder of the layer due to inherent deposition problems.

Silicon oxide layer 18 and silicon nitride layer 22 are utilized in formation of LOCOS over substrate 12. The remaining silicon oxide and silicon nitride layers (layers 20 and 24) are not utilized for formation of LOCOS, but rather are provided to equalize a stress across substrate 12. If layers 18 and 22 are provided without also providing layers 20 and 24, it is found that substrate 12 can deform. More specifically, silicon nitride layer 22 exerts a tensile force against surface 14 of substrate 12. Such tensile force can bow outer edges of substrate 12 downwardly unless it is balanced by a tensile force exerted on opposing surface 16 of substrate 12. Thus, silicon nitride layer 24 is provided proximate opposing surface 16 to exert a tensile force which balances the tensile force of silicon nitride layer 22.

Referring to FIG. 2, a patterned photoresist layer 26 is provided over layers 22 and 18. Patterned photoresist layer 26 defines LOCOS regions 28 of upper surface 14 of substrate 12.

Referring to FIG. 3, portions of layers 18 and 22 are removed to expose LOCOS regions 28 of upper surface 14. In subsequent processing that is not shown, patterned photoresist layer 26 is removed and field oxide is formed at LOCOS regions 28. The forming of field oxide can comprise, for example, exposing wafer fragment 10 to an oxidizing atmosphere to grow the field oxide.

A difficulty of the above-described process can occur when portions of layers 18 and 22 are removed. After such removal, there is less of upper silicon nitride layer 22 relative to lower silicon nitride layer 24. Thus, the tensile force provided by bottom silicon nitride layer 24 may no longer be balanced by the tensile force of upper silicon nitride layer 22. Accordingly, outer edges of substrate 12 can undesirably be bowed upwardly by the tensile force of bottom silicon nitride layer 24. Such bowing of the substrate can adversely affect subsequent processing steps. For instance, the bowing can cause mask misalignment in subsequent photolithography steps. It would be desirable to develop methods of LOCOS processing whereby bowing of substrate 12 is substantially eliminated. More generally, it would be desirable to develop methods of semiconductor wafer processing whereby silicon nitride induced pressures on a semiconductor wafer are alleviated.

SUMMARY OF THE INVENTION

In one aspect, the invention encompasses a method of forming a silicon nitride layer over a surface of a semiconductive wafer. The silicon nitride layer comprises at least two portions. One of the at least two portions generates a compressive force against the other of the at least two portions, and the other of the at least two portions generates a tensile force against the one of the at least two portions.

In another aspect, the invention encompasses a method of reducing stress on semiconductive wafer. The semiconductive wafer has a pair of opposing surfaces and has a greater amount of silicon nitride over one of the opposing surfaces than over an other of the opposing surfaces. The silicon nitride over the one of the opposing surfaces comprises a first portion, a second portion and a third portion. The first, second and third portions are elevationally displaced relative to one another, and the second portion is between the first and third portions. The second portion has a greater stoichiometric amount of silicon than the first and third portions. The semiconductive wafer is subjected to less stress than if the silicon nitride over the one of the opposing surfaces had a constant stoichiometric amount of silicon throughout its thickness.

In yet another aspect, the invention encompasses a semiconductive wafer assembly. The assembly comprises a semiconductive wafer substrate having a pair of opposing surfaces and a first silicon nitride layer over one of the opposing surfaces. The first silicon nitride layer comprises a first portion, a second portion and a third portion. The first, second and third portions are elevationally displaced relative to one another, and the second portion is between the first and third portions. The second portion has a greater stoichiometric amount of silicon than the first and third portions.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
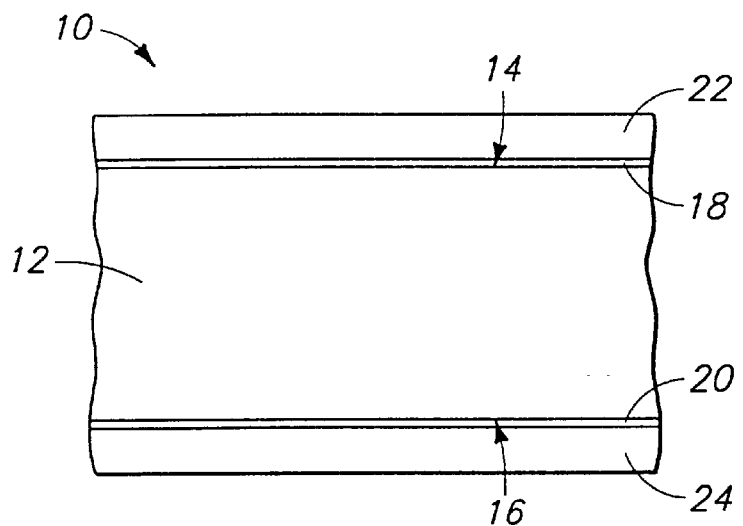
FIG. 1 is a diagrammatic, fragmentary, cross-sectional view of a semiconductive wafer at a preliminary step of a prior art process.
Figure 2:
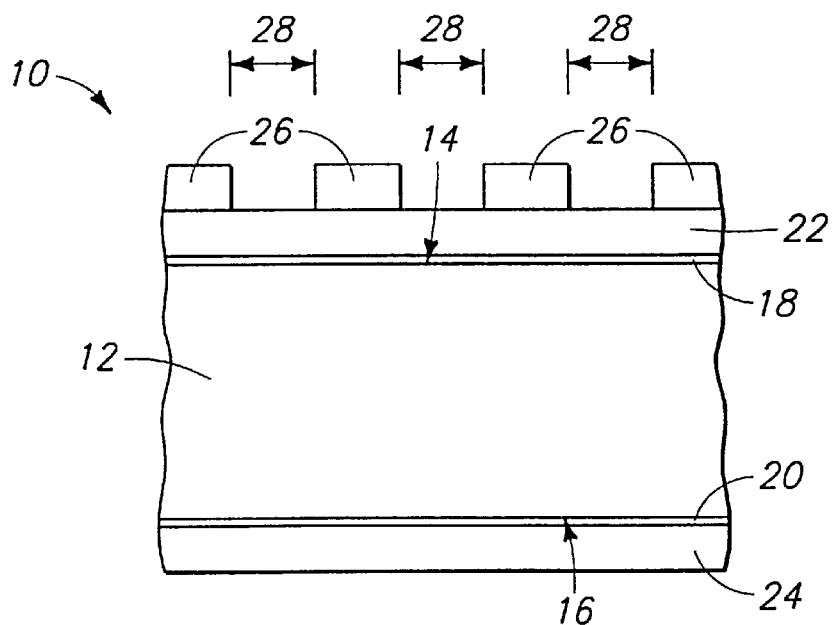
FIG. 2 is a view of the FIG. 1 wafer fragment shown at a prior art processing step subsequent to that of FIG. 1.

A semiconductor wafer processing method encompassed by the present invention is described with reference to FIGS. 4 and 5. In describing FIGS. 4 and 5, similar numbering to that utilized above in describing FIGS. 1–3 will be used, with differences indicated with the suffix "a" or by different numerals.

Figure 4:
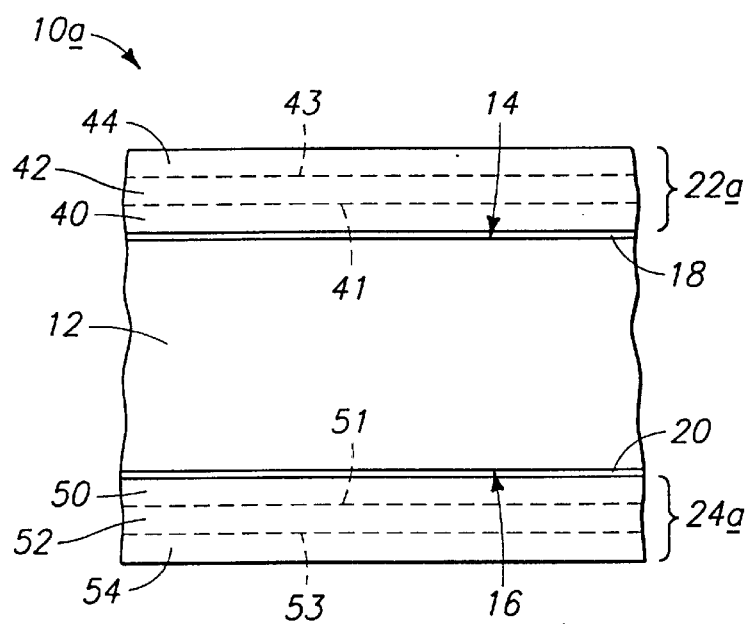
FIG. 4 is a diagrammatic, fragmentary, cross-sectional view of a semiconductor wafer fragment processed according to a method of the present invention, and shown at a processing step analogous to that shown in FIG. 1.

Referring to FIG. 4, a semiconductor wafer fragment 10a comprises a substrate 12 having first and second opposing surfaces 14 and 16, respectively. First and second silicon dioxide layers 18 and 20 are formed over first and second surfaces 14 and 16, respectively, and first and second silicon nitride layers 22a and 24a are formed over silicon dioxide layers 18 and 20.

Silicon nitride layers 22a and 24a differ from prior art silicon layers 22 and 24 (FIG. 1) in that each of silicon nitride layers 22a and 24a comprises three distinct portions. The three distinct portions of silicon nitride layer 22a are a first portion 40, a second portion 42 and a third portion 44. Interfaces between portions 40, 42 and 44 are illustrated in FIG. 4 as dashed lines 41 and 43. Second silicon nitride layer 24a comprises a first portion 50, a second portion 52 and a third portion 54, with interfaces between portions 50, 52 and 54 illustrated as dashed lines 51 and 53. For purposes of the following discussion, portions 40 and 50 are referred to as inner portions, as such portions are closest to substrate 12, and portions 44 and 54 are referred to as outer portions. Portions 42 and 52 are referred to as middle portions.

Preferably, inner portions 40 and 50, as well as outer portions 44 and 54, generate tensile forces against middle portions 42 and 52. Also preferably, middle portions 42 and 52 generate compressive forces against inner portions 40 and 50, and outer portions 44 and 54. Accordingly, portions 40, 42 and 44 create balancing forces against one another, and portions 50, 52 and 54 also create balancing forces against one another. Such balancing forces can alleviate a stress which would be against substrate 12 if an entirety of one or both of silicon nitride layers 22a and 24a generated only one of either a tensile force or a compressive force throughout its thickness.

Although the shown preferred embodiment utilizes silicon nitride layers comprising three portions, it is to be understood that the invention also encompasses silicon nitride layers comprising only two portions. Preferably, if the silicon nitride layers comprise only two portions, one of the two portions will generate a tensile force and the other will generate a compressive force. Also it is to be understood that although the shown portions of layers 22a and 24a are elevationally displaced relative to one another, the invention encompasses embodiments in which the tensile force generating portions of a silicon nitride layer are laterally or otherwise displaced from adjacent compressive force generating portions of the silicon nitride layer.

One way to form silicon nitride that generates tensile forces is to provide relatively low stoichiometric ratios of silicon to nitrogen within the silicon nitride. One way to form silicon nitride that generates compressive forces is to provide relatively high stoichiometric ratios of silicon to nitrogen within the silicon nitride. Specifically, if a stoichiometric ratio of silicon to nitrogen is 0.75 or less (for example, $Si_3N_4$) the silicon nitride will generate a tensile force. In contrast, if the stoichiometric ratio of silicon to nitrogen within the silicon nitride layer is 1.0 or greater (for example, $Si_4N_4$), the silicon nitride will generate a compressive force. In other words, a material represented by the stoichiometric formula $Si_xN_y$ will generate a tensile force if a ratio of x to y is 0.75 or less, and will generate a compressive force if the ratio of x to y is at least 1.0.

A method for measuring the stoichiometric ratio of silicon to nitrogen within a silicon nitride layer is to determine a refractive index of the layer. Specifically, the refractive index of silicon nitride goes up as the silicon nitride becomes more enriched with silicon. Accordingly, $Si_3N_4$ has a refractive index of no greater than 2.0, while $Si_4N_4$ has a refractive index of about 2.2, $Si_7N_4$ has a refractive index of about 2.5, and $Si_{10}N_1$ has a refractive index of about 3. Thus, another way of expressing if a silicon nitride material generates a compressive force or a tensile force is to express the refractive index of the material. Silicon nitride materials having refractive indices of 2.0 or less will generate tensile forces, and silicon nitride materials having refractive indices of about 2.1 or greater will generate compressive forces.

Silicon nitride layers 22a and 24a can be formed by, for example, chemical vapor deposition utilizing a silicon precursor gas and a nitrogen precursor gas. An example silicon precursor gas is $SiH_2Cl_2$ (dichlorosilane) and an example nitrogen precursor gas is $NH_3$ (ammonia). Chemical deposition processes utilizing dichlorosilane and ammonia can occur at, for example, a temperature of from about 700° C. to about 800° C., and a pressure of from about 100 mTorr to about 1 Torr.

The first, second and third portions of silicon nitride layers 22a and 24a will preferably be formed in a common and uninterrupted deposition process. By "common deposition process" it is meant a deposition process wherein a wafer is not removed from a reaction chamber between the time that an initial portion of a silicon nitride layer is formed and the time that a final portion of the silicon nitride layer is formed. By "uninterrupted deposition process" it is meant a process wherein the flow of at least one of the silicon precursor gas and the nitrogen precursor gas does not stop during the deposition process.

An example chemical vapor deposition process comprises providing $SiH_2Cl_2$ at a flow rate of about 100 standard cubic centimeters per minute (sccm) and $NH_3$ at a flow rate of from about 16 to about 17 sccm to form first portions 40 and 50 of silicon nitride layers 22a and 24a. Accordingly, the ratio of the silicon precursor to the nitrogen precursor in forming first portions 40 and 50 is about 1:3, or 0.33. Such ratio of silicon precursor to nitrogen precursor forms a silicon nitride material having a stoichiometric composition of approximately $Si_3N_4$ (a refractive index of less than 2.0). After formation of first portion 40, the ratio of silicon precursor gas to nitrogen precursor gas is adjusted to about 6, to deposit second portions 42 and 52 of silicon nitride layers 22a and 24a. Such ratio of silicon precursor gas to nitrogen precursor gas forms a silicon nitride material having a refractive index of about 2.3. After formation of second portions 42 and 52, the ratio of silicon precursor gas to nitrogen precursor gas is again adjusted to about 0.33 to form third portions 44 and 54 having stoichiometric compositions approximately equal to that of first portions 40 and 50.

In the above-described exemplary chemical vapor deposition process, the ratio of silicon precursor gas to nitrogen precursor gas utilized in formation of second portions 42 and 52 is at least about 15 times greater than the ratio utilized for formation of first and third portions 44. It is to be understood, however, that the relative ratios utilized in forming the first, second and third portions of silicon nitride layers 22a and 24a can be varied to adjust the relative amount of force generated by portions 40, 42, 44, 50, 52 and 54. Also, it is to be understood that the relative thicknesses of portions 40, 42, 44, 50, 52 and 54 can be adjusted to adjust the relative amount of stresses generated by such portions. Generally, a thicker portion will generate more force than a thinner portion. Preferably, the thicknesses and stoichiometries of portions 40, 42, 44, 50, 52 and 54 will be adjusted such that compressive and tensile forces balance within silicon nitride layers 22a and 24a to alleviate a tendency of either of the layers to warp substrate 12. Example thicknesses of portions 40, 42 and 44 are 500 Angstroms, 1000 Angstroms, and 500 Angstroms, respectively. Preferably, portions 50, 52 and 54 will have identical thicknesses to portions 40, 42, and 44, respectively, as portions 50, 52 and 54 are preferably formed simultaneously with portions 40, 42 and 44, respectively.

In the above-discussed embodiment, inner portions 40 and 50 comprise substantially identical stoichiometries to outer portions 44 and 54 (the stoichiometries are described as "substantially" identical to indicate that some variation can occur between layers deposited under identical deposition conditions). It is to be understood, however, that the invention encompasses other embodiments in which the relative stoichiometries of inner portions 40 and 50 varies from the stoichiometries of outer portions 44 and 54, and in which the stoichiometries of inner portions 40 and 50 vary from one another.

Figure 5:
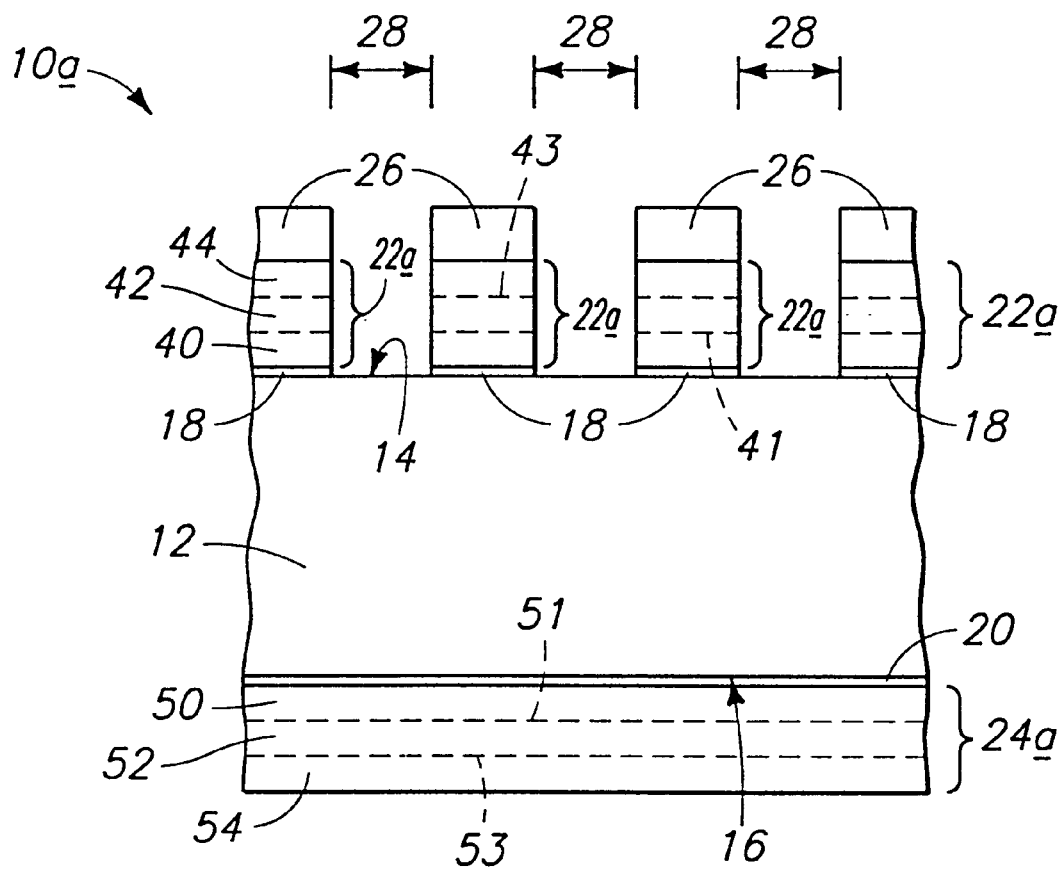
FIG. 5 is a view of the FIG. 4 wafer fragment shown at a processing step subsequent to that of FIG. 4.

Referring to FIG. 5, a patterned photoresist layer 26 is provided over silicon nitride layer 22a to define field oxide regions 28 of substrate 12. Subsequently, portions of silicon nitride layer 22a and silicon dioxide layer 18 are removed to expose field oxide regions 28. In additional processing which is not shown, field oxide can be formed at field oxide regions 28. Such field oxide can be formed by conventional methods, such as those discussed above in the "background" section of this disclosure.

Figure 3:
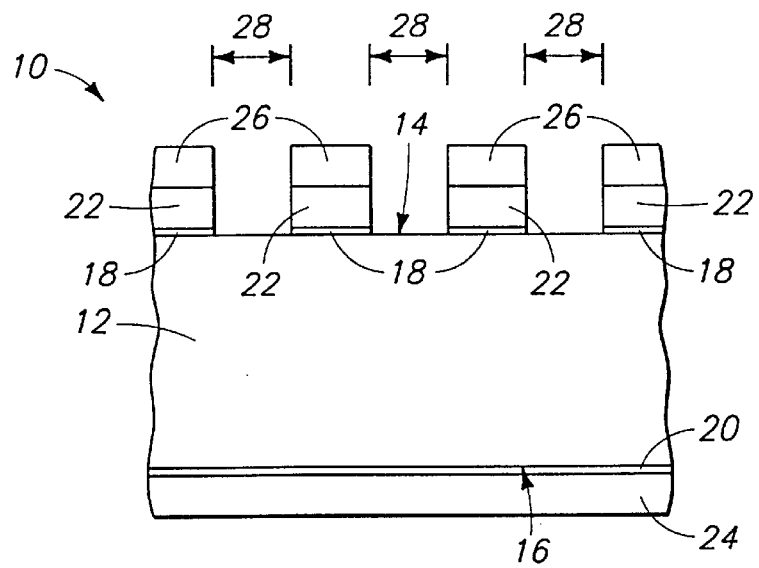
FIG. 3 is a view of the FIG. 1 wafer fragment shown at a prior art processing step subsequent to that of FIG. 2.

Wafer 10a of FIG. 5 is shown at a processing step analogous to the prior art processing step at which wafer fragment 10 is shown in FIG. 3. A difference between wafer fragment 10a of FIG. 5 and wafer fragment 10 of FIG. 3 is that the silicon nitride layer 24a of FIG. 5 comprises portions generating compressive forces, as well as portions generating tensile forces. Such forces within silicon nitride layer 24a can balance one another so that layer 24a has less tendency to bow substrate 12 then would a prior art silicon nitride layer (such as layer 24 of FIG. 3).

Although the invention is described above with reference to LOCOS fabrication, it is to be understood that the invention has application to other semiconductor wafer fabrication processes besides LOCOS fabrication. For instance, the invention has application to processes in which a silicon nitride layer is provided along only one surface of a semiconductor wafer. Silicon nitride can be provided along only one surface of a semiconductive wafer if, for example, the silicon nitride is selectively deposited on only one of the semiconductive wafer opposing surfaces 14 and 16. As another example, the silicon nitride can be provided along only one surface of a semiconductive wafer if the silicon nitride is deposited on both opposing surfaces of a wafer and then an entirety of the silicon nitride is removed from one of the opposing surfaces.

Although the shown embodiments comprise a silicon dioxide layer between a silicon nitride layer and a semiconductive wafer substrate, it is to be understood that the invention also encompasses embodiments in which a silicon nitride layer is formed directly on a semiconductive wafer substrate, as well as embodiments in which the silicon nitride layer is formed on other substrates.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A semiconductive wafer assembly comprising:
   a semiconductive wafer substrate; and
   a silicon nitride layer over the substrate, the silicon nitride layer comprising at least two portions, one of said at least two portions generating a compressive force against the other of the at least two portions, and the other of the at least two portions generating tensile force against the one of the at least two portions.

2. The semiconductor wafer assembly of claim 1 wherein the one of the at least two portions comprises a greater stoichiometric amount of silicon than the other of the at least two portions.

3. The semiconductor wafer assembly of claim 1 wherein the substrate comprises monocrystalline silicon and has two opposing surfaces, wherein the silicon nitride layer is over one of the opposing surfaces, and further comprising no silicon nitride over the other of the two opposing surfaces.

4. The semiconductor wafer assembly of claim 1 wherein the substrate comprises monocrystalline silicon and has two opposing surfaces, wherein the silicon nitride layer is over one of the opposing surfaces and is defined as a first silicon nitride layer, the assembly further comprising a second silicon nitride layer over the other of the two opposing surfaces, the second silicon nitride layer comprising at least two portions substantially identical in chemical composition to the at least two portions of the first silicon nitride layer.

5. A semiconductive wafer assembly, comprising:
 a semiconductive material substrate; and
 a silicon nitride layer over the substrate, the silicon nitride layer comprising a first portion, a second portion and a third portion, the first, second and third portions being elevationally displaced relative to one another, the second portion being between the first and third portions, the second portion having a greater stoichiometric amount of silicon than the first and third portions.

6. The semiconductor wafer assembly of claim 5 further comprising a layer comprising silicon dioxide between the silicon nitride layer and the substrate.

7. The semiconductor wafer assembly of claim 5 wherein the first and third portions comprise approximately equivalent stoichiometric amounts of silicon.

8. The semiconductor wafer assembly of claim 5 wherein the second portion stoichiometric amount of silicon is at least about 10% greater than the stoichiometric amount of silicon of either of the first and third portions.

9. The semiconductor wafer assembly of claim 5 wherein the first and third portions comprise approximately equivalent stoichiometric amounts of silicon, and wherein the second portion stoichiometric amount of silicon is at least about 10% greater than said approximately equivalent stoichiometric amount.

10. The semiconductor wafer assembly of claim 5 wherein the substrate comprises monocrystalline silicon and has a pair of opposing surfaces, wherein the silicon nitride layer is over one of the opposing surfaces and is defined as a first silicon nitride layer, the assembly further comprising a second silicon nitride layer over the other of said pair of opposing surfaces, the second silicon nitride layer comprising a first portion, a second portion and a third portion, the first, second and third portions of the second silicon nitride layer being elevationally displaced relative to one another, the second portion of the second silicon nitride layer being between the first and third portions of the second silicon nitride layer, the second portion of the second silicon nitride layer having a greater stoichiometric amount of silicon than the first and third portions of the second silicon nitride layer.

11. The semiconductor wafer assembly of claim 10 wherein the first, second and third portions of the second silicon nitride layer are substantially chemically identical to the first, second and third portions, respectively, of the first silicon nitride layer.

12. The semiconductor wafer assembly of claim 10 further comprising:
 a first layer comprising silicon dioxide between the first silicon nitride layer and the semiconductive wafer; and
 a second layer comprising silicon dioxide between the second silicon nitride layer and the semiconductive wafer.

* * * * *

UNITED STATES PATENT AND TRADEMARK OFFICE
CERTIFICATE OF CORRECTION

PATENT NO.    : 6,429,151 B1
DATED         : August 6, 2002
INVENTOR(S)   : John T. Moore et al.

It is certified that error appears in the above-identified patent and that said Letters Patent is hereby corrected as shown below:

<u>Column 1,</u>
Line 11, replace "No. 6,093,951, filed on Jun. 18, 1998;" with -- No. 6,093,956, filed on Jun. 18, 1998; --
Line 43, replace "to any supporting structure, including, but: not" with -- to any supporting structure, including, but not --
Line 48, replace "Silicon dioxide a layers 18 and 20 function as" with -- Silicon dioxide layers 18 and 20 function as --

Signed and Sealed this

Twenty-ninth Day of April, 2003

JAMES E. ROGAN
*Director of the United States Patent and Trademark Office*